United States Patent
Arishima et al.

(10) Patent No.: US 10,447,953 B2
(45) Date of Patent: Oct. 15, 2019

(54) IMAGING APPARATUS, IMAGING SYSTEM, AND MOVING OBJECT

(71) Applicant: CANON KABUSHIKI KAISHA, Tokyo (JP)

(72) Inventors: Yu Arishima, Yokohama (JP); Hirofumi Totsuka, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 153 days.

(21) Appl. No.: 15/809,482

(22) Filed: Nov. 10, 2017

(65) Prior Publication Data

US 2018/0146145 A1    May 24, 2018

(30) Foreign Application Priority Data

Nov. 24, 2016    (JP) .................. 2016-228063

(51) Int. Cl.
| | |
|---|---|
| H04N 5/357 | (2011.01) |
| H04N 5/378 | (2011.01) |
| H01L 27/146 | (2006.01) |
| H04N 5/369 | (2011.01) |
| B60Q 9/00 | (2006.01) |

(52) U.S. Cl.
CPC ....... *H04N 5/357* (2013.01); *H01L 27/14634* (2013.01); *H01L 27/14636* (2013.01); *H01L 27/14645* (2013.01); *H01L 27/14649* (2013.01); *H04N 5/378* (2013.01); *H04N 5/379* (2018.08); *B60Q 9/00* (2013.01); *B60Y 2400/3015* (2013.01); *H01L 27/14621* (2013.01); *H01L 27/14627* (2013.01)

(58) Field of Classification Search
CPC ........ H04N 5/357; H04N 5/379; H04N 5/378; H01L 27/14634; H01L 27/14645; H01L 27/14636; H01L 27/14649; H01L 27/14621; H01L 27/14627; B60Q 9/00; B60Y 2400/3015
USPC ...................................... 250/208.1
See application file for complete search history.

(56) References Cited

U.S. PATENT DOCUMENTS 8,957,358 B2 *  2/2015  Wan .................. H01L 27/14609
                                                250/208.1
9,362,325 B2 *  6/2016  Baba ................ H01L 27/14634

FOREIGN PATENT DOCUMENTS

JP    2014523148 A    9/2014

* cited by examiner

*Primary Examiner* — Seung C Sohn
(74) *Attorney, Agent, or Firm* — Canon U.S.A., Inc. IP Division

(57) ABSTRACT

An imaging apparatus includes first and second substrates respectively including first pixels and second pixels arranged thereon. The first pixels each includes a first photoelectric conversion unit and a first transistor configured to output a first signal based on a charge generated in the first photoelectric conversion unit. The second pixels each includes a second photoelectric conversion unit and a second transistor configured to output a second signal based on a charge generated in the second photoelectric conversion unit. The first and second substrates are stacked via an insulation film.

20 Claims, 15 Drawing Sheets

FIG.2
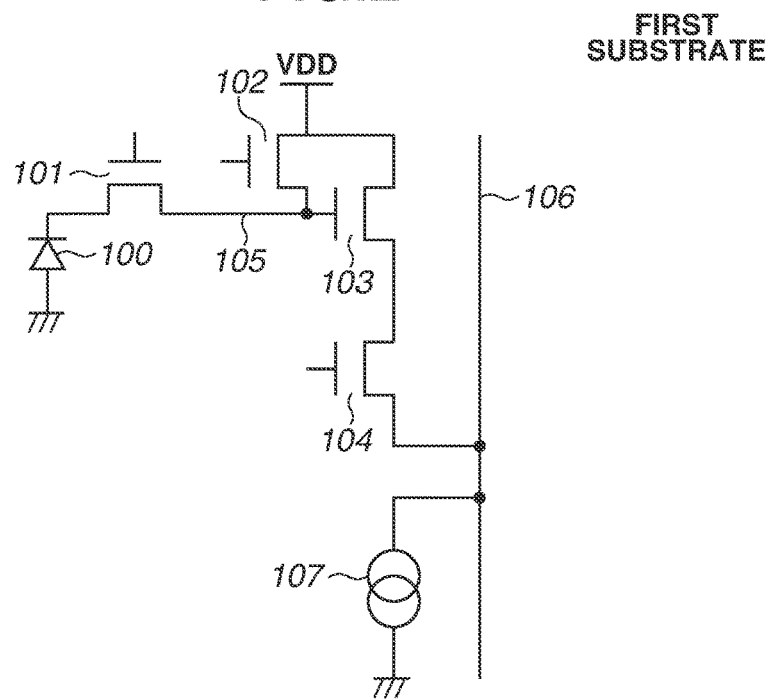
FIRST SUBSTRATE
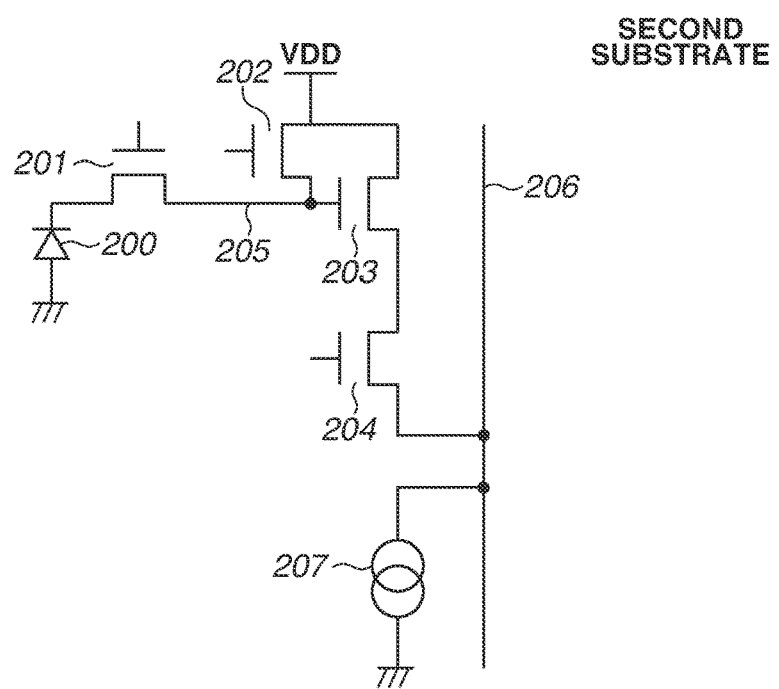
SECOND SUBSTRATE

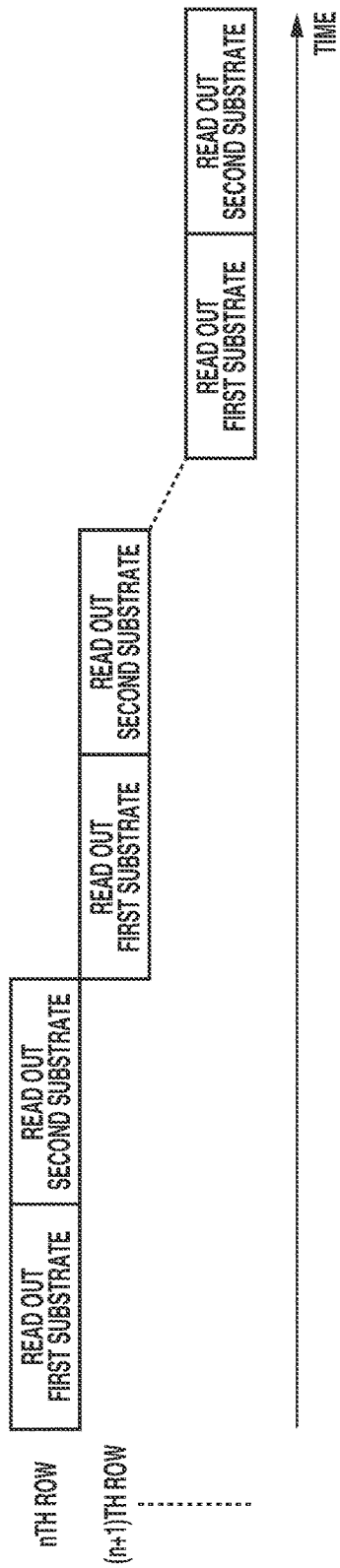
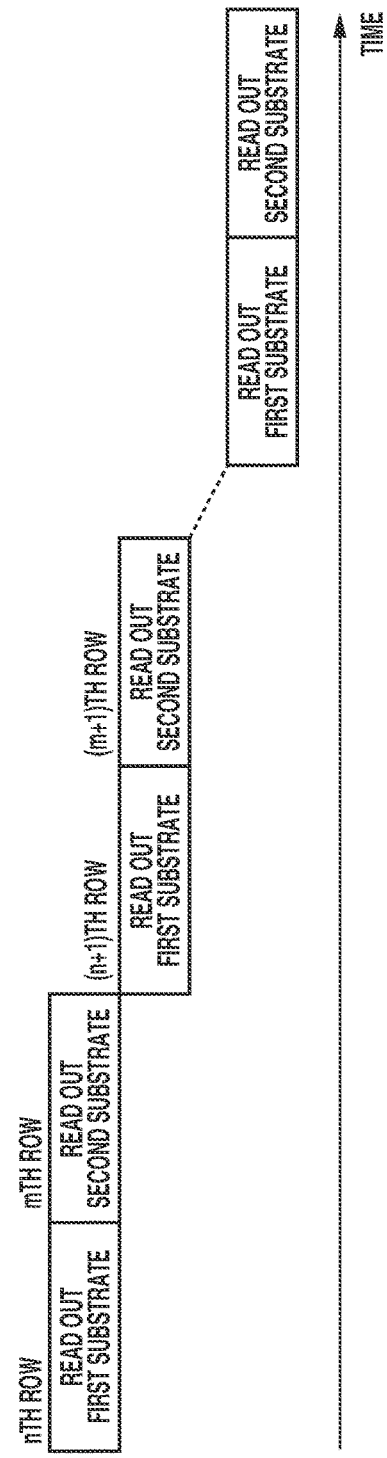

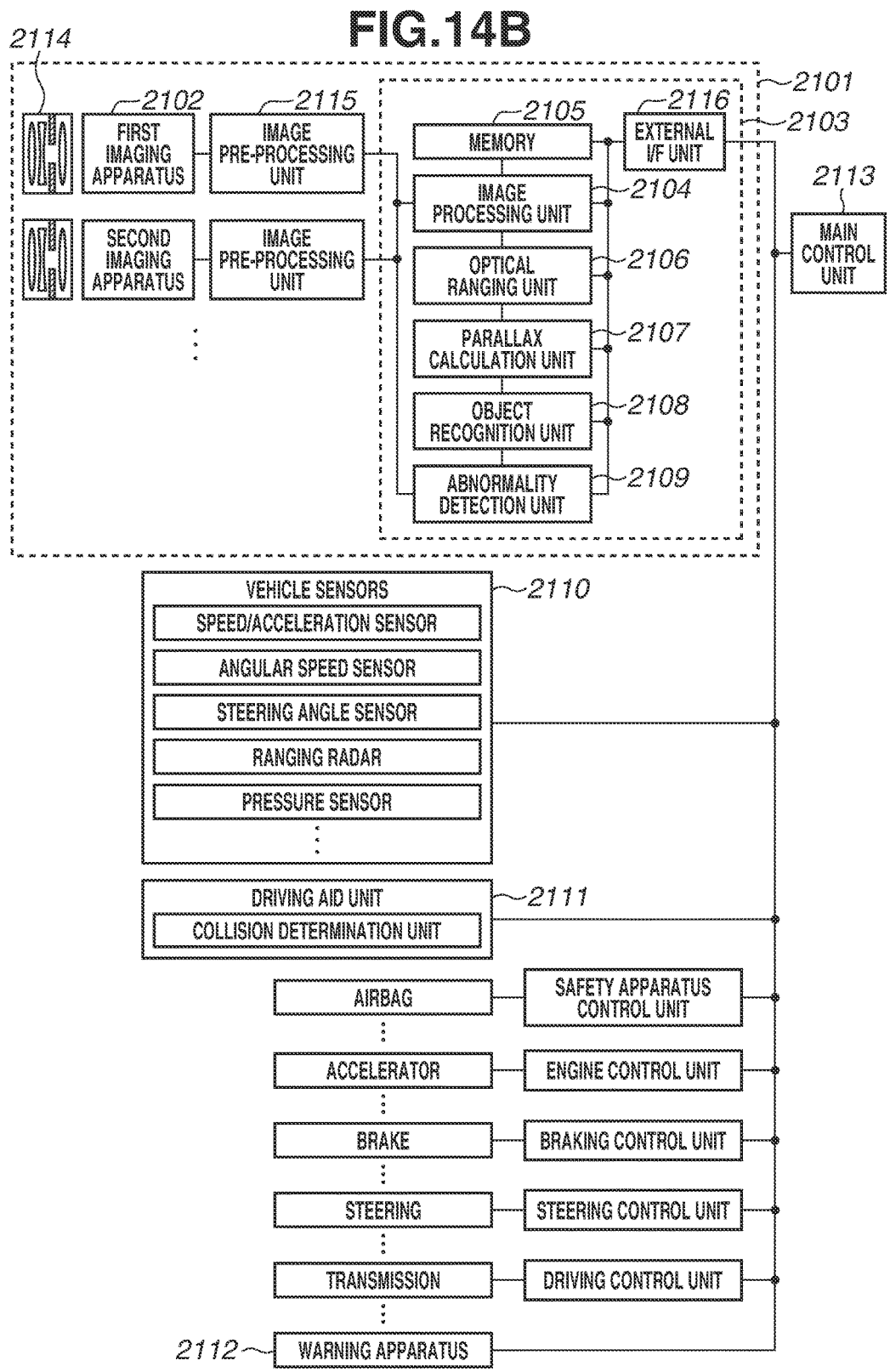

US 10,447,953 B2

IMAGING APPARATUS, IMAGING SYSTEM, AND MOVING OBJECT

BACKGROUND OF THE INVENTION

Field of the Invention

The present disclosure relates to an imaging apparatus, an imaging system, and a moving object.

Description of the Related Art

Japanese Unexamined Patent Application Publication (Translation of PCT Application) No. 2014-523148 discloses an imaging apparatus including two stacked substrates. A first photodiode is formed on a first substrate, and a second photodiode is formed on a second substrate. The two photodiodes are electrically connected to each other via two pads. Japanese Unexamined Patent Application Publication (Translation of PCT Application) No. 2014-523148 discusses that high quantum efficiency can be achieved by such a configuration.

SUMMARY OF THE INVENTION

According to an aspect of the embodiments, an imaging apparatus includes a first substrate including a plurality of first pixels arranged thereon. The plurality of first pixels each includes a first photoelectric conversion unit and a first transistor configured to output a signal based on a charge generated in the first photoelectric conversion unit. The imaging apparatus further includes a second substrate including a plurality of second pixels arranged thereon. The plurality of second pixels each includes a second photoelectric conversion unit and a second transistor configured to output a signal based on a charge generated in the second photoelectric conversion unit. The first substrate and the second substrate are stacked via an insulation film interposed therebetween. An orthogonal projection of the first photoelectric conversion unit onto a plane in parallel with an interface between the first substrate and the insulation film and an orthogonal projection of the second photoelectric conversion unit onto the plane at least partially overlap each other. An input node of the first transistor and an input node of the second transistor are electrically separated from each other.

According to another aspect of the embodiments, an imaging apparatus includes a first substrate including a plurality of first pixels arranged thereon. The plurality of first pixels each includes a first photoelectric conversion unit and a first transistor configured to output a signal based on a charge generated in the first photoelectric conversion unit. The imaging apparatus further includes a second substrate including a plurality of second pixels arranged thereon. The plurality of second pixels each includes a second photoelectric conversion unit and a second transistor configured to output a signal based on a charge generated in the second photoelectric conversion unit. The first substrate and the second substrate are stacked via an insulation film interposed therebetween. A part of incident light incident on the first photoelectric conversion unit passes through the first photoelectric conversion unit to be incident on the second photoelectric conversion unit of the second substrate. An input node of the first transistor and an input node of the second transistor are electrically separated from each other.

Further features of the disclosure will become apparent from the following description of exemplary embodiments with reference to the attached drawings.

BRIEF DESCRIPTION OF THE DRAWINGS

FIG. 2 illustrates an equivalent circuit of a pixel of the imaging apparatus.
FIGS. 7A and 7B each schematically illustrate an operation of the imaging apparatus.
FIGS. 14A and 14B are each a block diagram illustrating an exemplary embodiment of a moving object.

DESCRIPTION OF THE EMBODIMENTS

According to the imaging apparatus discussed in Japanese Unexamined Patent Application Publication (Translation of PCT Application) No. 2014-523148, charges generated in the two photodiodes are each transferred to an input node of a transistor forming an amplification unit of a pixel. Then, each of the transferred charges is converted into a voltage signal at this input node. However, in the imaging apparatus discussed in Japanese Unexamined Patent Application Publication (Translation of PCT Application) No. 2014-523148, the input node includes a portion where the two substrates are connected to each other, i.e., the two pads. Therefore, a capacitance of the input node is likely to increase. As a result, efficiency of converting the charge into the voltage may reduce, and a signal-to-noise (SN) ratio may reduce.

Exemplary embodiments according to the present disclosure will be described below with reference to the accompanying drawings. Each embodiment provides an imaging apparatus capable of improving the SN ratio.

Figure 1A:
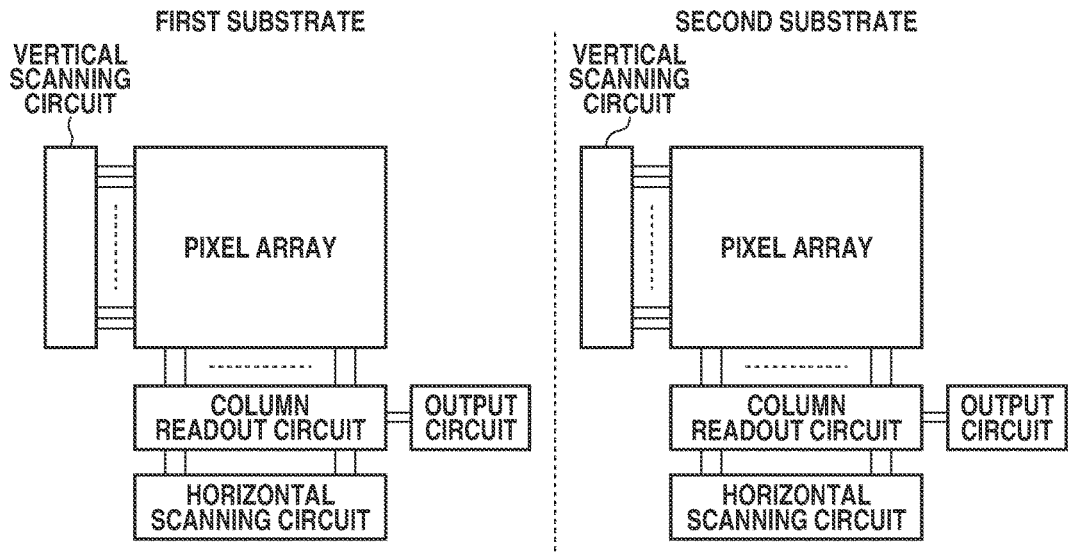
FIGS. 1A and 1B each schematically illustrate an entire configuration of an imaging apparatus.
Figure 1B:
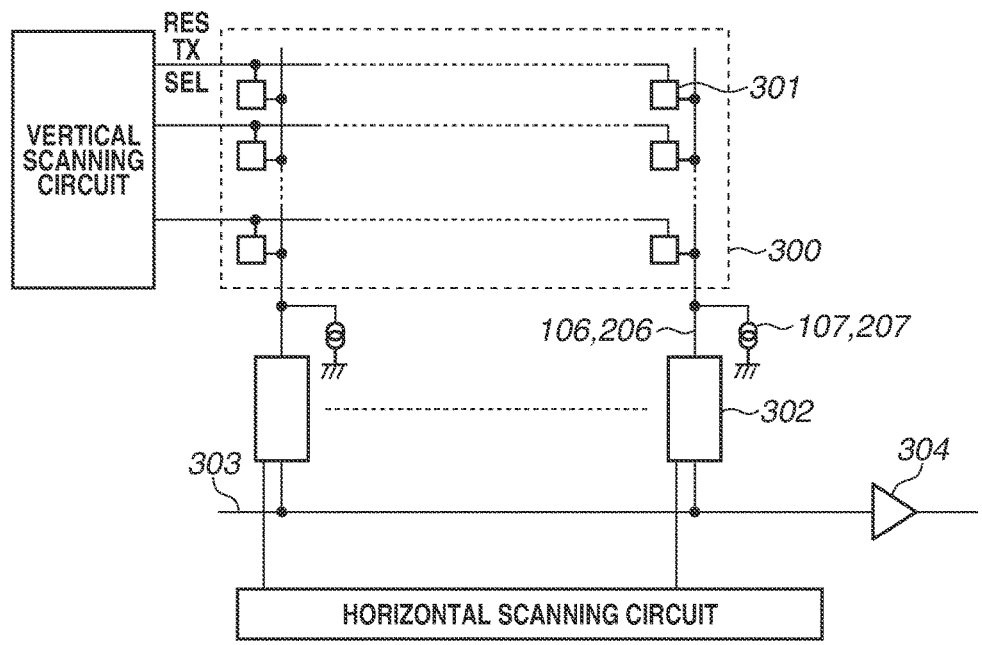

A first exemplary embodiment will be described. FIGS. 1A and 1B each schematically illustrate a configuration of an imaging apparatus according to the first exemplary embodiment. The imaging apparatus includes a first substrate and a second substrate. FIG. 1A schematically illustrates a configuration of each of the first substrate and the second substrate. Each of the first substrate and the second substrate includes a pixel array, and a signal processing circuit including a vertical scanning circuit, a horizontal scanning circuit, a column readout circuit, an output circuit, and the like. The first substrate and the second substrate are stacked in such a manner that a photoelectric conversion unit of the first substrate and a photoelectric conversion unit of the second substrate overlap each other in a planar view, i.e., when being viewed along an optical axis of incident light.

FIG. 1B schematically illustrates a configuration of the pixel array, the column readout circuit, and the output circuit of each of the first substrate and the second substrate. The description regarding FIG. 1B applies to both the first substrate and the second substrate.

A pixel array 300 includes a plurality of pixels 301. The plurality of pixels 301 is arranged so as to form a plurality of columns and a plurality of rows. A plurality of pixels 301 belonging to one column is connected to one column output line 106. A plurality of pixels 301 belonging to one row is connected to a common control line. A control signal is supplied from the vertical scanning circuit to the control line.

A current source 107 (207) and a column readout circuit 302 are connected to the column output line 106 (206). The column readout circuit 302 performs signal processing on a signal output to the column output line 106 or the column output line 206. The signal processing performed by the column readout circuit 302 includes, for example, holding the signal, sampling and holding the signal, amplifying the signal, removing noise from the signal, converting the signal from an analog signal to a digital signal (hereinafter referred to as an AD conversion), adding a plurality of signals, and averaging a plurality of signals. The column readout circuit 302 may perform any one of these kinds of signal processing, or may perform a plurality of kinds of signal processing among them.

The horizontal scanning circuit sequentially outputs signals supplied from a plurality of column readout circuits 302 to a second output line 303. An output circuit 304 outputs a signal of the second output line 303 to outside the imaging apparatus.

FIG. 2 illustrates an equivalent circuit of the pixel 301 according to the present exemplary embodiment. The imaging apparatus according to the present exemplary embodiment includes the pixel 301 on each of the first substrate and the second substrate. The pixel 301 of the first substrate and the pixel 301 of the second substrate are indicated by the same equivalent circuit.

The pixel 301 of the first substrate includes a photoelectric conversion unit 100, a transfer transistor 101, a reset transistor 102, an amplification transistor 103, and a selection transistor 104. The photoelectric conversion unit 100 is, for example, a photodiode. A drain of the reset transistor 102 and a drain of the amplification transistor 103 are connected to a power source line that supplies power source VDD. The transfer transistor 101 transfers a signal charge generated in the photoelectric conversion unit 100 to a floating diffusion unit 105 (hereinafter referred to as the FD unit 105). The FD unit 105 is connected to a gate electrode of the amplification transistor 103. The amplification transistor 103 and the current source 107 connected to the column output line 106 form a source follower circuit. By such a configuration, the amplification transistor 103 supplies an output according to a voltage of the FD unit 105 to the column output line 106 via the selection transistor 104. In other words, the FD unit 105 forms an input node of the amplification transistor 103. The reset transistor 102 resets a gate of the amplification transistor 103, i.e., the FD unit 105 to a predetermined potential (a reset potential). The vertical scanning circuit (not illustrated) selects the row from which the signal is output.

The pixel 301 of the second substrate includes a photoelectric conversion unit 200, a transfer transistor 201, a reset transistor 202, an amplification transistor 203, and a selection transistor 204. The photoelectric conversion unit 200 is, for example, a photodiode. A drain of the reset transistor 202 and a drain of the amplification transistor 203 are connected to the power source line that supplies the power source VDD. The transfer transistor 201 transfers a signal charge generated in the photoelectric conversion unit 200 to an FD unit 205. The FD unit 205 is connected to a gate electrode of the amplification transistor 203. The amplification transistor 203 and the current source 207 connected to the column output line 206 form a source follower circuit. By such a configuration, the amplification transistor 203 supplies an output according to a voltage of the FD unit 205 to the column output line 206 via the selection transistor 204. In other words, the FD unit 205 forms an input node of the amplification transistor 203. The reset transistor 202 resets a gate of the amplification transistor 203, i.e., the FD unit 205 to a predetermined potential (a reset potential). The vertical scanning circuit (not illustrated) selects the row from which the signal is output.

Different reference numerals are used to indicate the components included in the pixel 301 of the first substrate and the components included in the pixel 301 of the second substrate for convenience sake. However, identically named components have the same function.

Figure 3:
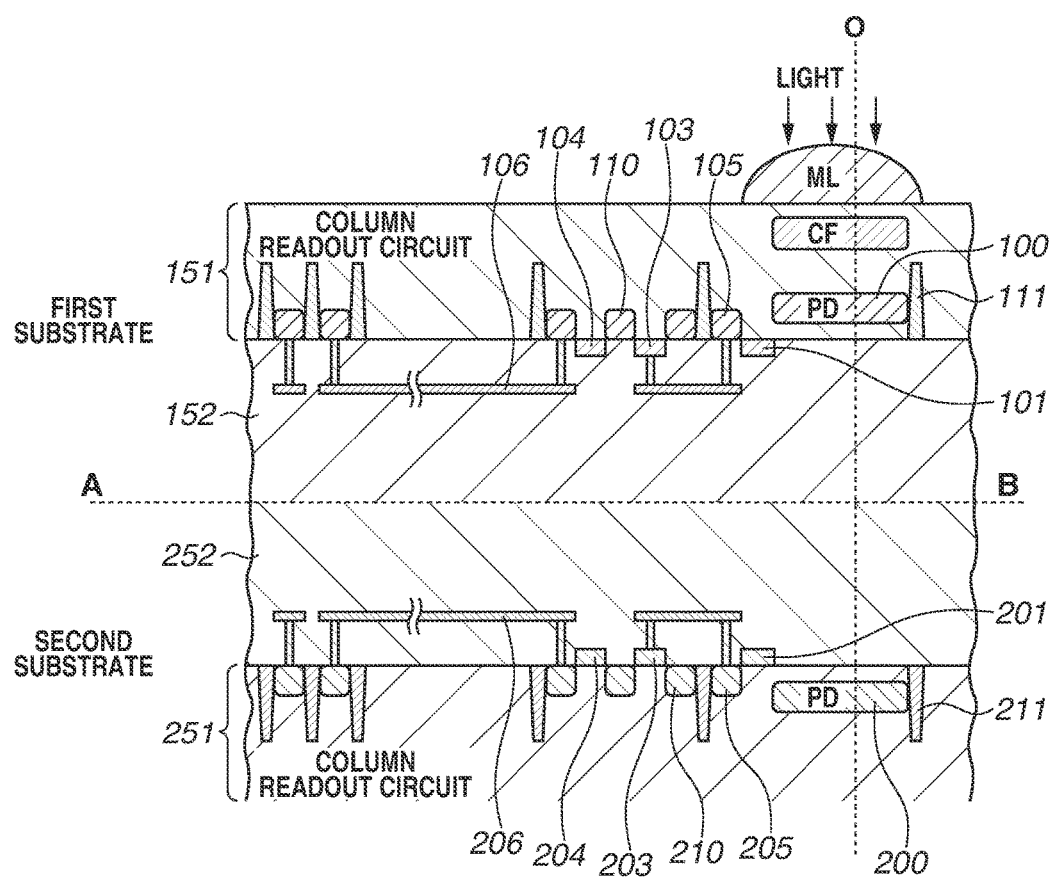
FIG. 3 schematically illustrates a cross-sectional structure of the imaging apparatus.

Next, a cross-sectional structure of the imaging apparatus will be described. FIG. 3 schematically illustrates the cross-sectional structure of the imaging apparatus. The first substrate includes a semiconductor substrate 151 made from silicon or the like, and a wiring and a gate electrode disposed on the semiconductor substrate 151. The second substrate includes a semiconductor substrate 251 made from silicon or the like, and a wiring and a gate electrode disposed on the semiconductor substrate 251.

The first substrate and the second substrate are stacked. A dotted line AB illustrated in FIG. 3 indicates a surface where the two substrates are in contact with each other. In the present exemplary embodiment, the first substrate and the second substrate include an interlayer insulation film 152 and an interlayer insulation film 252 covering the wirings, respectively. Then, the interlayer insulation film 152 of the first substrate and the interlayer insulation film 252 of the second substrate are in contact with each other. By such a configuration, the first substrate and the second substrate are stacked via an insulation film formed by the interlayer insulation film 152 and the interlayer insulation film 252.

FIG. 3 illustrates the column output line 106 as the wiring laid on the first substrate and the column output line 206 as the wiring laid on the second substrate. The column output line 106 and the column output line 206 are laid between the semiconductor substrate 151 and the semiconductor substrate 251. The column output line 106 and the semiconductor substrate 151 are connected to each other via a contact plug, while a part of the interlayer insulation film 152 is disposed between a part of the column output line 106 and a part of the semiconductor substrate 151. The column output line 206 and the semiconductor substrate 251 are connected to each other via a contact plug, while a part of the interlayer insulation film 252 is disposed between a part of the column output line 206 and a part of the semiconductor substrate 251.

Further, optical members such as a micro lens ML and a color filter CF are disposed on a surface where the light is incident. In the present exemplary embodiment, the light is incident on the first substrate. Therefore, the micro lens ML and the color filter CF are disposed only on the first substrate. However, the optical members such as the micro lens ML and the color filter CF may also be disposed on the second substrate.

A semiconductor region forming the photoelectric conversion unit 100 is provided on the semiconductor substrate 151. A semiconductor region forming the photoelectric conversion unit 200 is provided on the semiconductor substrate 251. A semiconductor region forming the source or the drain of the transistor, or the FD unit (105 or 110, and 205 or 210 illustrated in FIG. 3) is provided on each of the semiconductor substrate 151 and the semiconductor substrate 251. Further, a separation portion 111 and a separation portion 211 for separating the semiconductor regions from each other are provided on the semiconductor substrate 151 and the semiconductor substrate 251, respectively.

In the present exemplary embodiment, the photoelectric conversion unit 100 included in the pixel 301 of the first substrate and the photoelectric conversion unit 200 included in the pixel 301 of the second substrate at least partially overlap with each other in a planar view. The plane is, for example, a plane in parallel with an interface between the semiconductor substrate 151 and the interlayer insulation film 152. In other words, an orthogonal projection of the photoelectric conversion unit 100 onto the plane in parallel with this interface and an orthogonal projection of the photoelectric conversion unit 200 onto the plane in parallel with this interface at least partially overlap with each other. The orthogonal projection means a projection along a normal line.

From another perspective, the photoelectric conversion unit 100 included in the pixel 301 of the first substrate and the photoelectric conversion unit 200 included in the pixel 301 of the second substrate at least partially overlap each other when being viewed in a direction along the optical axis of the incident light. FIG. 3 illustrates an optical axis O of the incident light. The optical axis O is, for example, a line normal to the incident surface. As illustrated in FIG. 3, the optical axis O of the incident light passes through both the photoelectric conversion unit 100 and the photoelectric conversion unit 200 when being viewed in cross section. In an exemplary embodiment in which the interface between the semiconductor substrate 151 and the interlayer insulation film 152 is not flat, the photoelectric conversion unit 100 and the photoelectric conversion unit 200 are arranged along the optical axis O in this manner.

When being viewed along the optical axis O of the incident light, a shape of the photoelectric conversion unit 100 and a shape of the photoelectric conversion unit 200 may be the same as each other. Alternatively, one of the photoelectric conversion unit 100 and the photoelectric conversion unit 200 may contain the other of them. Alternatively, a part of the photoelectric conversion unit 100 may overlap a part of the photoelectric conversion unit 200.

A part of the light incident on the imaging apparatus is converted into the charge in the photoelectric conversion unit 100 included in the pixel 301 of the first substrate. Light transmitted through the photoelectric conversion unit 100 is incident on the photoelectric conversion unit 200 included in the pixel 301 of the second substrate, and is then converted into the charge in the photoelectric conversion unit 200. In this manner, a part of the incident light is converted into the charge in the photoelectric conversion unit 100, and another part of the incident light is converted into the charge in the photoelectric conversion unit 200. These charges are read out by the amplification transistor 103 included in the pixel 301 of the first substrate and the amplification transistor 203 included in the pixel 301 of the second substrate, respectively, independently of one another.

In the present exemplary embodiment, the input node of the amplification transistor 103 (the FD unit 105) and the input node of the amplification transistor 203 (the FD unit 205) are electrically separated from each other. In other words, the imaging apparatus is in a state where the input node of the amplification transistor 103 (the FD unit 105) and the input node of the amplification transistor 203 (the FD unit 205) are not short-circuited. Therefore, a capacitance of the FD unit 105 and a capacitance of the FD unit 205 can be reduced.

The charges photoelectrically converted in the photoelectric conversion unit 100 and the photoelectric conversion unit 200 are converted into voltage signals by the FD unit 105 and the FD unit 205, respectively. A conversion gain increases as the capacitance reduces according to a relation equation $V=Q/C$.

In a case where the photoelectric conversion unit 100 and the photoelectric conversion unit 200 share the FD unit, the capacitance of the FD unit is likely to increase. As a result, an amplitude of the voltage signal is undesirably compressed. In this case, a large gain should be applied at a circuit at a subsequent stage, and a noise component also increases. In other words, an image quality may reduce.

On the other hand, in the present exemplary embodiment, the photoelectric conversion unit 100 and the photoelectric conversion unit 200 do not share a single FD unit. Instead thereof, the different FD unit 105 and FD unit 205 are assigned to the photoelectric conversion unit 100 and the photoelectric conversion unit 200, respectively. Therefore, a voltage signal having a larger amplitude is input to the amplification transistor 103 or 203. As a result, the SN ratio can be improved.

A signal based on the charge generated in the photoelectric conversion unit 100 of the first substrate (hereinafter referred to as a first signal) and a signal based on the charge generated in the photoelectric conversion unit 200 of the second substrate (hereinafter referred to as a second signal) have, for example, pieces of information regarding light beams in different wavelength bands. Since the first substrate has the incident surface, the first signal contains information regarding light having a relatively short wavelength, and the second signal contains information regarding light having a relatively long wavelength. Omission of the color filter CF allows light beams of different colors in visible light to be detected individually. Alternatively, use of light in a predetermined wavelength band in the visible light and a color filter CF permitting infrared light to be transmitted therethrough allows the visible light and the infrared light to be detected individually. By being configured in this manner, the imaging apparatus according to the present exemplary embodiment can capture a color image with high definition. Alternatively, the imaging apparatus according to the present exemplary embodiment can acquire an image formed from the visible light and an image formed from infrared light at the same time. In these examples, the first signal and the second signal are used for the same purpose.

On the other hand, the first signal and the second signal may be used for different purposes. For example, the first signal can be used for imaging and the second signal can be used for focus detection. Besides that, for example, the first signal can be used for imaging and the second signal can be used for ranging according to the Time of Flight (TOF) method. By being configured in this manner, the imaging apparatus according to the present exemplary embodiment can perform an imaging operation and an operation other than the imaging operation, such as the focus detection, at the same time.

As illustrated in FIG. 1A, in the present exemplary embodiment, the first substrate and the second substrate each include the signal processing circuit. The signal processing circuit of the first substrate processes the signal based on the charge generated in the photoelectric conversion unit 100 of the first substrate (the first signal). The signal processing circuit of the second substrate processes the signal based on the charge generated in the photoelectric conversion unit 200 of the second substrate (the second signal). According to the configuration illustrated in FIG. 1A, the first signal and the second signal are output to outside the imaging apparatus by the different output circuits 304, respectively.

The first signal and the second signal output to outside may be added to each other by an external signal processing apparatus. Alternatively, as an exemplary modification, the first signal and the second signal may be added or averaged inside the imaging apparatus. For achieving that, the signal processing circuit of the first substrate and the signal processing circuit of the second substrate can be electrically connected to each other. A connection portion where the wiring of the first substrate and the wiring of the second substrate are connected to each other is included in a wiring path connecting the two signal processing circuits to each other. For example, in the case where the column readout circuit 302 carries out the AD conversion, the connection portion is included in a wiring path of a signal line that transmits the digital signal. Alternatively, in the case where the column readout circuit 302 includes an analog amplification circuit, the connection portion is included in a wiring path of a signal line that transmits the amplified analog signal.

In the present exemplary embodiment, sensitivity can be improved by adding or averaging the two signals generated on the different substrates. Alternatively, according to the present exemplary embodiment, a new signal that has been unable to be acquired by the conventional technique can be acquired by adding or averaging the two signals generated on the different substrates.

In the above-described manner, in the present exemplary embodiment, the input node of the amplification transistor 103 (the FD unit 105) and the input node of the amplification transistor 203 (the FD unit 205) are electrically separated from each other. According to such a configuration, the SN ratio can be improved.

A second exemplary embodiment will be described. An imaging apparatus according to the second exemplary embodiment is different from the imaging apparatus according to the first exemplary embodiment in terms of a part of the signal processing circuit disposed only on the second substrate in the second exemplary embodiment. Therefore, in the following description, the second exemplary embodiment will be described mainly focusing on differences from the first exemplary embodiment and omitting descriptions of similar features to the first exemplary embodiment.

Figure 4:
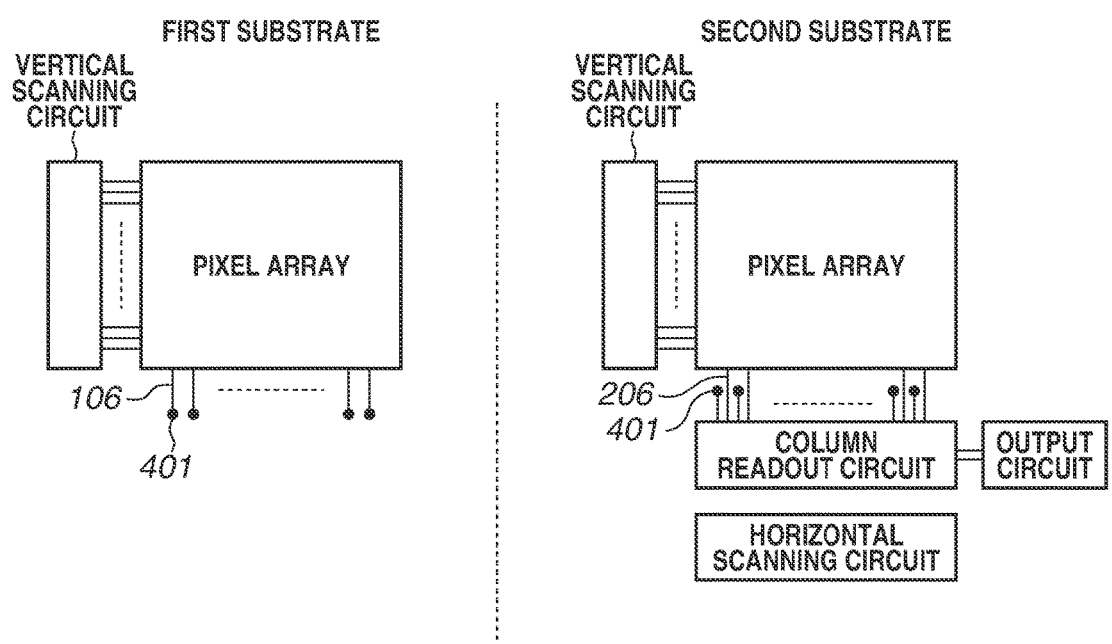
FIG. 4 schematically illustrates an entire configuration of an imaging apparatus.

FIG. 4 schematically illustrates a configuration of the imaging apparatus according to the second exemplary embodiment. The imaging apparatus includes a first substrate and a second substrate. FIG. 4 schematically illustrates a configuration of each of the first substrate and the second substrate. Each of the first substrate and the second substrate includes a pixel array and a vertical scanning circuit. A horizontal scanning circuit, a column readout circuit, and an output circuit included in a signal processing circuit are disposed only on the second substrate. The first substrate and the second substrate are stacked in such a manner that a photoelectric conversion unit of the first substrate and a photoelectric conversion unit of the second substrate overlap each other in a planar view, i.e., when being viewed along an optical axis of incident light.

FIG. 4 further illustrates a connection portion 401 where a wiring of the first substrate and a wiring of the second substrate are connected to each other. The column output line 106 of the first substrate is connected to the signal processing circuit disposed on the second substrate via the connection portion 401. In other words, the connection portion 401 is included in a wiring path connecting the column output line 106 of the first substrate and the signal processing circuit disposed on the second substrate to each other. By such a configuration, the first substrate and the second substrate share the signal processing circuit (the horizontal scanning circuit, the column readout circuit, and the output circuit) disposed on the second substrate.

Figure 5A:
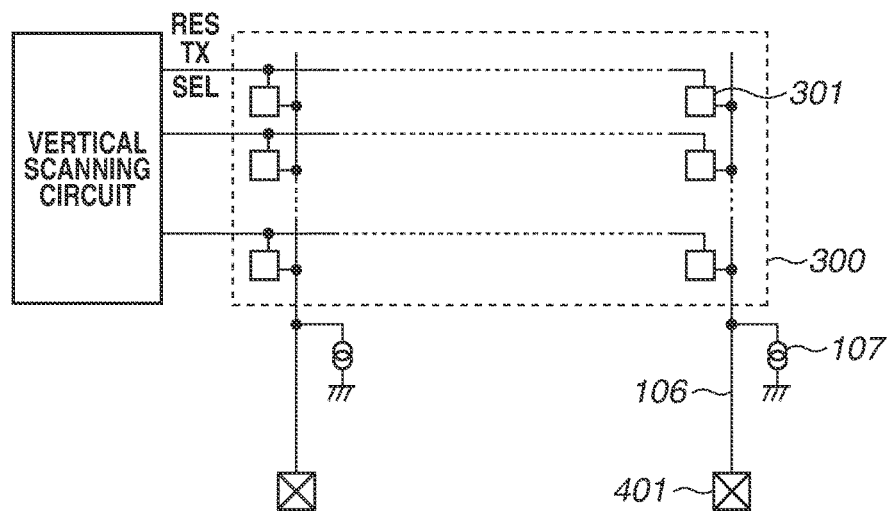
FIGS. 5A and 5B each schematically illustrate the entire configuration of the imaging apparatus.

FIG. 5A schematically illustrates a configuration of a signal processing circuit of the first substrate. Components having similar functions to the components illustrated in FIG. 1B are identified by the same reference numerals as FIG. 1B. The description about FIG. 1B entirely applies to the components having the similar functions to the components illustrated in FIG. 1B.

As illustrated in FIG. 5A, the column output line 106 is connected to the current source 107 and the connection portion 401. The column readout circuit 302, the horizontal scanning circuit, and the output circuit 304 are not disposed on the first substrate.

Figure 5B:
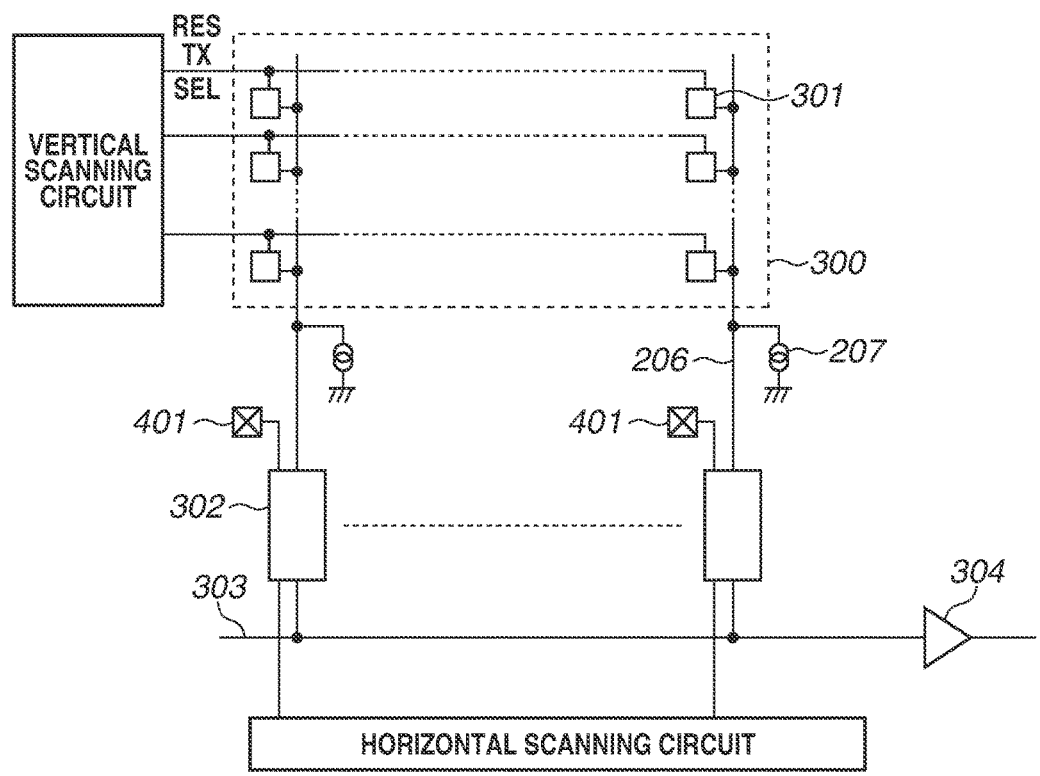

FIG. 5B schematically illustrates a configuration of the signal processing circuit of the second substrate. Components having similar functions to the components illustrated in FIG. 1B are identified by the same reference numerals as FIG. 1B. The description about FIG. 1B entirely applies to the components having the similar functions to the components illustrated in FIG. 1B.

In the present exemplary embodiment, the column output line 106 of the first substrate and the column output line 206 of the second substrate are connected to the single column readout circuit 302. The column output line 106 of the first substrate is connected to the column readout circuit 302 disposed on the second substrate via the connection portion 401. The column readout circuit 302 may include a selection unit that selects the signal of the column output line 106 or the signal of the column output line 206.

An equivalent circuit of the pixel 301 according to the present exemplary embodiment is similar to the equivalent circuit of the pixel 301 according to the first exemplary embodiment. In other words, FIG. 2 illustrates the equivalent circuit of the pixel 301 according to the present exemplary embodiment. A description about the equivalent circuit of the pixel 301 will be omitted here.

Figure 6:
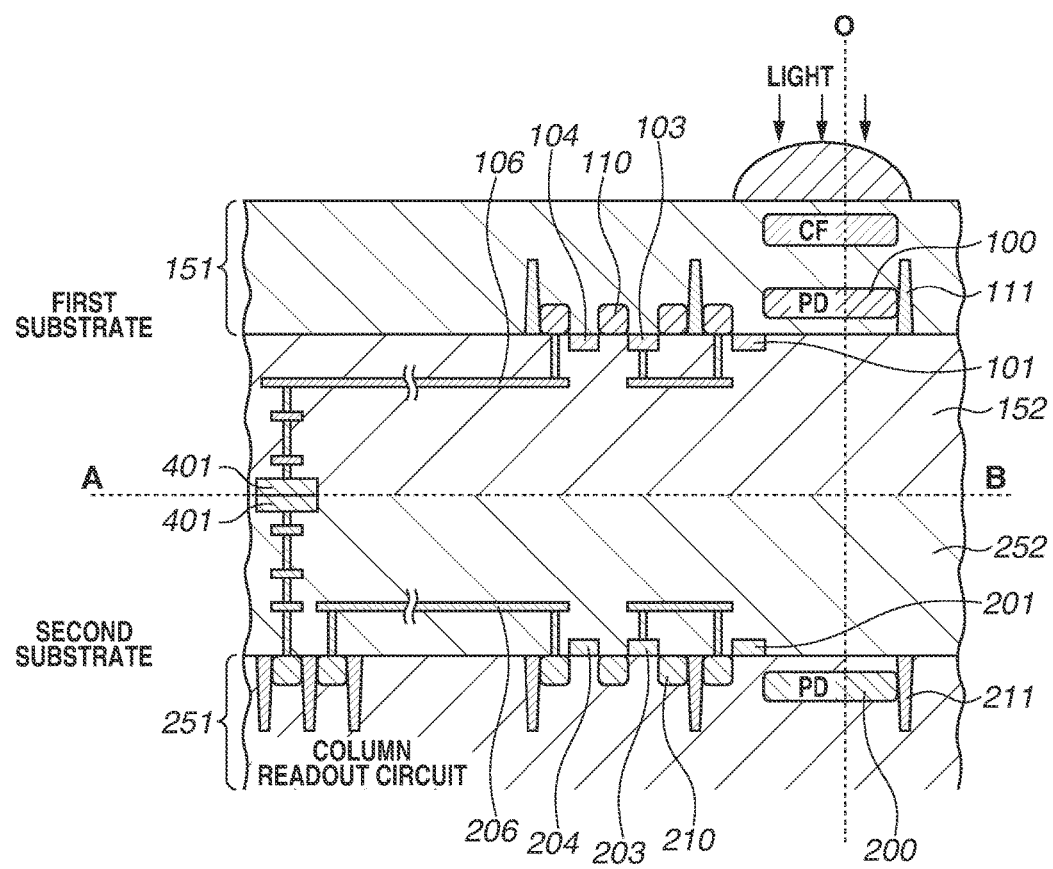
FIG. 6 schematically illustrates a cross-sectional structure of the imaging apparatus.

Next, a cross-sectional structure of the imaging apparatus will be described. FIG. 6 schematically illustrates the cross-sectional structure of the imaging apparatus. Components having similar functions to the components illustrated in FIG. 3 are identified by the same reference numerals as FIG. 3. The description about FIG. 3 entirely applies to the components having the similar functions to the components illustrated in FIG. 3.

The first substrate and the second substrate are stacked. A dotted line AB illustrated in FIG. 6 indicates a surface where the two substrates are in contact with each other. In the present exemplary embodiment, the first substrate and the second substrate include the interlayer insulation film 152 and the interlayer insulation film 252 covering the wirings, respectively. Then, the interlayer insulation film 152 of the first substrate and the interlayer insulation film 252 of the second substrate are in contact with each other. By such a configuration, the first substrate and the second substrate are stacked via the insulation film formed by the interlayer insulation film 152 and the interlayer insulation film 252.

FIG. 6 illustrates the column output line 106 as the wiring laid on the first substrate and the column output line 206 as the wiring laid on the second substrate. The column output line 106 and the column output line 206 are laid between the semiconductor substrate 151 and the semiconductor substrate 251. The column output line 106 and the semiconductor substrate 151 are connected to each other via a contact plug, while a part of the interlayer insulation film 152 is disposed between a part of the column output line 106 and a part of the semiconductor substrate 151. The column output line 206 and the semiconductor substrate 251 are connected to each other via a contact plug, while a part of the interlayer insulation film 252 is disposed between a part of the column output line 206 and a part of the semiconductor substrate 251.

The semiconductor region forming the photoelectric conversion unit 100 is provided on the semiconductor substrate 151. The semiconductor region forming the photoelectric conversion unit 200 is provided on the semiconductor substrate 251. The semiconductor region forming the source or the drain of the transistor, or the FD unit (110 and 210 illustrated in FIG. 6) is provided on each of the semiconductor substrate 151 and the semiconductor substrate 251. Further, the separation portion 111 and the separation portion 211 for separating the semiconductor regions from each other are provided on the semiconductor substrate 151 and the semiconductor substrate 251, respectively.

In the present exemplary embodiment, the photoelectric conversion unit 100 included in the pixel 301 of the first substrate and the photoelectric conversion unit 200 included in the pixel 301 of the second substrate at least partially overlap with each other in the planar view. The plane is, for example, the plane in parallel with the interface between the semiconductor substrate 151 and the interlayer insulation film 152. In other words, the orthogonal projection of the photoelectric conversion unit 100 onto the plane in parallel with this interface and the orthogonal projection of the photoelectric conversion unit 200 onto the plane in parallel with this interface at least partially overlap with each other. The orthogonal projection means the projection along the normal line.

From another perspective, the photoelectric conversion unit 100 included in the pixel 301 of the first substrate and the photoelectric conversion unit 200 included in the pixel 301 of the second substrate at least partially overlap each other when being viewed in the direction along the optical axis of the incident light. FIG. 6 illustrates the optical axis O of the incident light. The optical axis O is, for example, the line normal to the incident surface. As illustrated in FIG. 6, the optical axis O of the incident light passes through both the photoelectric conversion unit 100 and the photoelectric conversion unit 200 when being viewed in cross section. In the exemplary embodiment in which the interface between the semiconductor substrate 151 and the interlayer insulation film 152 is not flat, the photoelectric conversion unit 100 and the photoelectric conversion unit 200 are arranged along the optical axis O in this manner.

When being viewed along the optical axis O of the incident light, the shape of the photoelectric conversion unit 100 and the shape of the photoelectric conversion unit 200 may be the same as each other. Alternatively, one of the photoelectric conversion unit 100 and the photoelectric conversion unit 200 may contain the other of them. Alternatively, a part of the photoelectric conversion unit 100 may overlap a part of the photoelectric conversion unit 200.

A part of the light incident on the imaging apparatus is converted into the charge in the photoelectric conversion unit 100 included in the pixel 301 of the first substrate. Light transmitted through the photoelectric conversion unit 100 is incident on the photoelectric conversion unit 200 included in the pixel 301 of the second substrate, and is then converted into the charge in the photoelectric conversion unit 200. In this manner, a part of the incident light is converted into the charge in the photoelectric conversion unit 100, and another part of the incident light is converted into the charge in the photoelectric conversion unit 200. These charges are read out by the amplification transistor 103 included in the pixel 301 of the first substrate and the amplification transistor 203 included in the pixel 301 of the second substrate, respectively, independently of one another.

In the present exemplary embodiment, the column output line 106 of the first substrate is connected to the transistor forming the column readout circuit 302 of the second substrate via the connection portion 401. The connection portion 401 has such a structure that two wiring layers are in contact with each other. By being configured in this manner, the signal processing circuit disposed on the second substrate processes both the signal based on the charge generated in the photoelectric conversion unit 100 of the first substrate (hereinafter referred to as the first signal) and the signal based on the charge generated in the photoelectric conversion unit 200 of the second substrate (hereinafter referred to as the second signal). More specifically, the column readout circuit 302 disposed on the second substrate performs, on the first signal, the signal processing such as holding the signal, sampling and holding the signal, amplifying the signal, removing noise from the signal, the AD conversion on the signal, adding a plurality of signals, and averaging a plurality of signals. Further, the column readout circuit 302 disposed on the second substrate performs, on the second signal, the signal processing such as holding the signal, sampling and holding the signal, amplifying the signal, removing noise from the signal, the AD conversion on the signal, adding a plurality of signals, and averaging a plurality of signals. The column readout circuit 302 can select which signal should be subjected to the signal processing, from between the first signal and the second signal.

FIG. 7A schematically illustrates an operation of the imaging apparatus according to the present exemplary embodiment. In the operation illustrated in FIG. 7A, first, a signal of the pixel 301 in an n-th row in the pixel array of the first substrate (the first signal) is read out. Next, a signal of the pixel 301 in the n-th row in the pixel array of the second substrate (the second signal) is read out. After that, a signal of the pixel 301 in an (n+1)th row in the pixel array of the first substrate (another first signal) is read out. After that, similar readout is repeated.

Now, a time period during which the signal in each of the columns is horizontally transferred may be included in a time period during which the n-th row of the first substrate is read out. Further, holding the signal in, for example, a memory of the column readout circuit 302 allows a time period during which the first signal is horizontally transferred and a time period during which the second signal is read out to partially overlap with each other.

As illustrated in FIG. 7B, the signal may be read out in such a manner that the first signal is read out from the pixel 301 in the n-th row of the first substrate, and after that, the second signal is read out from the pixel 301 of an m-th row (m≠n) of the second substrate.

The purposes for which the first signal and the second signal are used are similar to the first exemplary embodiment. The first signal and the second signal have, for example, pieces of information regarding light beams in wavelength bands different from each other. Alternatively, the first signal and the second signal may be used for different purposes.

In the present exemplary embodiment, the signal processing circuit disposed on the second substrate processes both the first signal output to the column output line 106 of the first substrate and the second signal output to the column output line 206 of the second substrate. The number of column readout circuits 302 can be reduced by using the common signal processing circuit for the processing of the first signal and the processing of the second signal in this manner. As a result, a size of the imaging apparatus can be reduced. Further, an effect of reducing power consumption can be acquired by reading out the signals sequentially as illustrated in FIGS. 7A and 7B.

Further, similarly to the first exemplary embodiment, in the present exemplary embodiment, the input node of the amplification transistor 103 (the FD unit 105) and the input node of the amplification transistor 203 (the FD unit 205) are electrically separated from each other. According to such a configuration, the SN ratio can be improved.

A third exemplary embodiment will be described. An imaging apparatus according to the present exemplary embodiment is different from the imaging apparatus according to the first exemplary embodiment and the imaging apparatus according to the second exemplary embodiment in terms of the first substrate and the second substrate sharing only the output circuit 304 in the present exemplary embodiment. Therefore, in the following description, the third exemplary embodiment will be described mainly focusing on differences from the first and second exemplary embodiments and omitting descriptions of similar features to the first and second exemplary embodiments.

Figure 8:
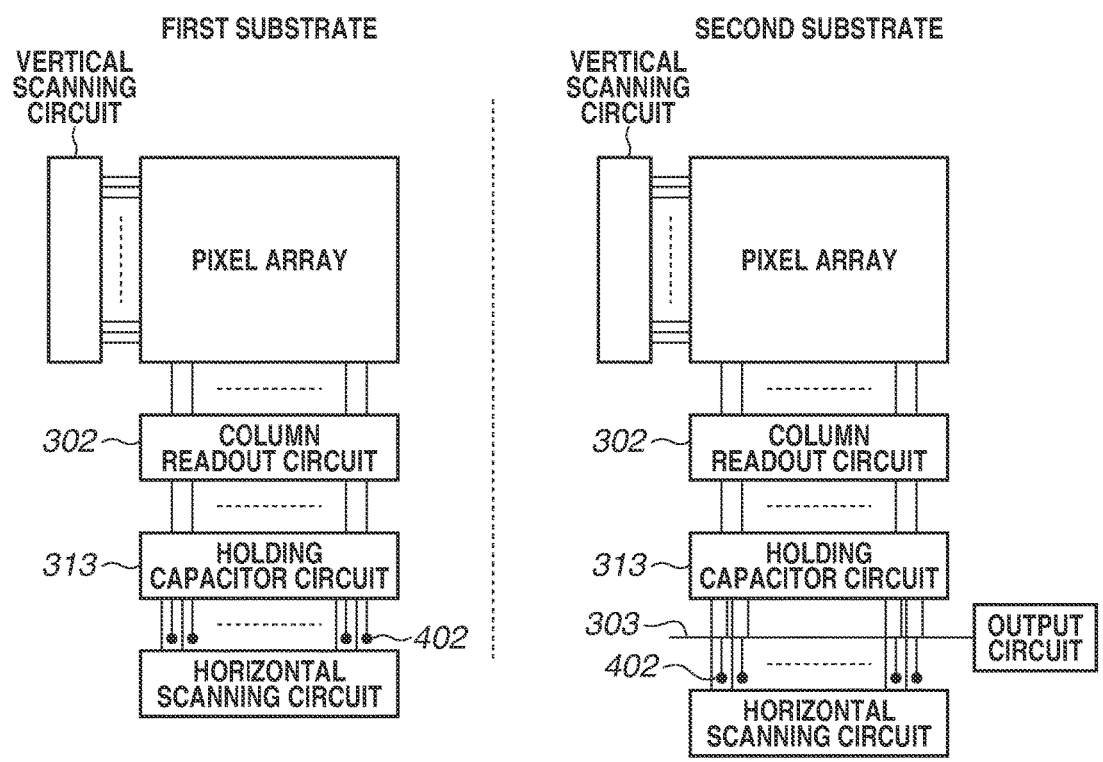
FIG. 8 schematically illustrates an entire configuration of an imaging apparatus.

FIG. 8 schematically illustrates a configuration of the imaging apparatus according to the third exemplary embodiment. The imaging apparatus includes a first substrate and a second substrate. Each of the first substrate and the second substrate includes a pixel array, a vertical scanning circuit, a column readout circuit, a holding capacitor circuit, and a horizontal scanning circuit. An output circuit included in a signal processing circuit is disposed only on the second substrate. The first substrate and the second substrate are stacked in such a manner that a photoelectric conversion unit of the first substrate and a photoelectric conversion unit of the second substrate overlap each other in a planar view, i.e., when being viewed along an optical axis of incident light.

A holding capacitor circuit 313 is connected at a stage subsequent to the column readout circuit 302. The holding capacitor circuit 313 holds the signal output from the column readout circuit 302. The horizontal scanning circuit outputs the signal held in the holding capacitor circuit 313 to the second output line 303 sequentially. The output circuit 304 outputs the signal of the second output line 303 to outside the imaging apparatus.

FIG. 8 further illustrates a connection portion 402 where a wiring of the first substrate and a wiring of the second substrate are connected to each other. The holding capacitor circuit 313 of the first substrate is connected to the signal processing circuit disposed on the second substrate via the connection portion 402. In other words, the connection portion 402 is included in a wiring path connecting the holding capacitor circuit 313 of the first substrate and the signal processing circuit disposed on the second substrate to each other. The connection portion 402 has such a structure that two wiring layers are in contact with each other, although this is not illustrated. By such a configuration, the first substrate and the second substrate share the signal processing circuit (the output circuit) disposed on the second substrate.

Figure 9A:
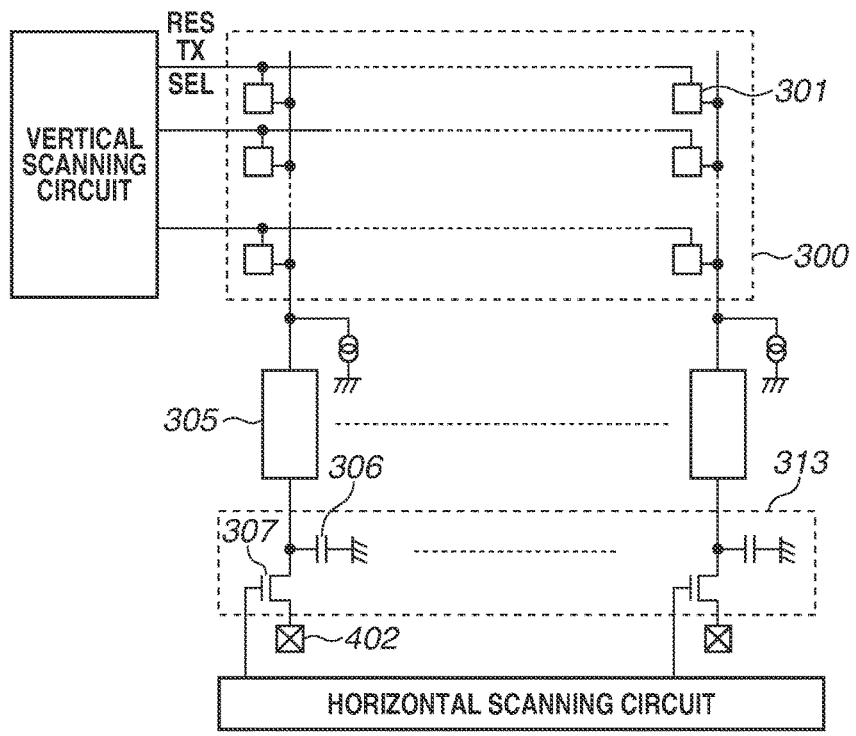
FIGS. 9A and 9B each schematically illustrate the entire configuration of the imaging apparatus.
Figure 9B:
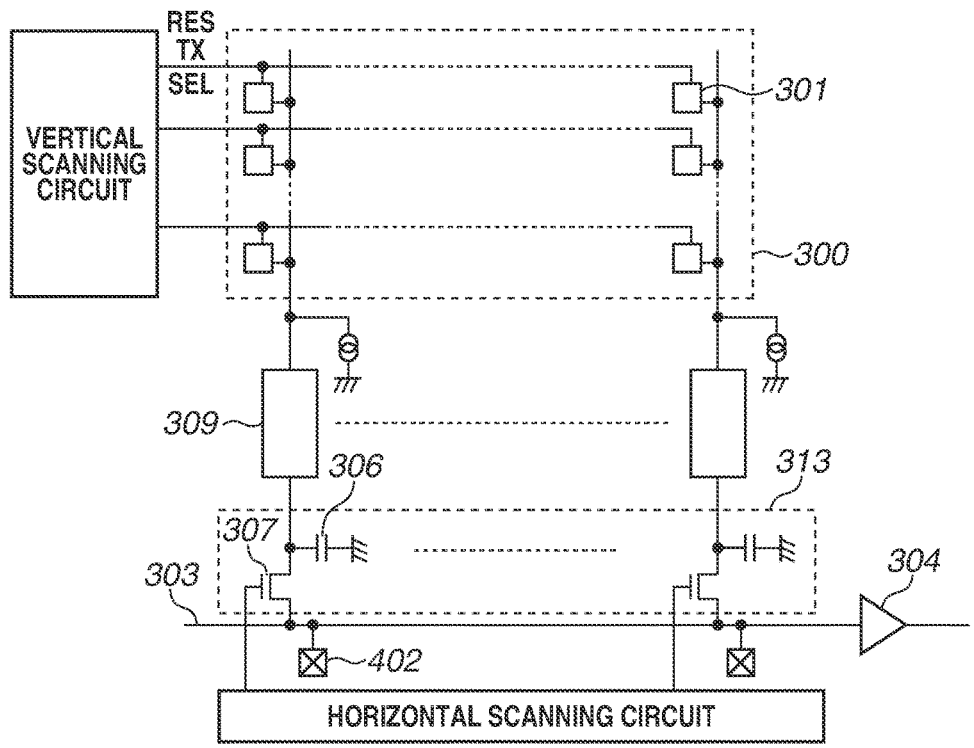

FIG. 9A schematically illustrates a configuration of the signal processing circuit of the first substrate. FIG. 9B schematically illustrates a configuration of the signal processing circuit of the second substrate. Components having similar functions to the components illustrated in FIG. 1B are identified by the same reference numerals as FIG. 1B. The description about FIG. 1B entirely applies to the components having the similar functions to the components illustrated in FIG. 1B.

The holding capacitor circuit 313 disposed on the first substrate and the holding capacitor circuit 313 disposed on the second substrate each include a capacitive element 306 and a transfer switch 307. A control signal from the horizontal scanning circuit is input to a gate of the transfer switch 307. The transfer switch 307 of the first substrate connects the capacitive element 306 and the connection portion 402 to each other. Then, the holding capacitor circuit 313 of the first substrate is connected to the second output line 303 via the connection portion 402. The transfer switch 307 of the second substrate connects the capacitive element 306 and the second output line 303 to each other. The signal of the second output line 303 is input to the output circuit 304.

An equivalent circuit of the pixel 301 according to the present exemplary embodiment is similar to the equivalent circuit of the pixel 301 according to the first exemplary embodiment. In other words, FIG. 2 illustrates the equivalent circuit of the pixel 301 according to the present exemplary embodiment. A description about the equivalent circuit of the pixel 301 will be omitted here.

As described above, in the present exemplary embodiment, the first substrate and the second substrate share the second output line 303 and the output circuit 304. The output circuit 304 disposed on the second substrate outputs the signal based on the charge generated in the photoelectric conversion unit 100 of the first substrate (the first signal) and the signal based on the charge generated in the photoelectric conversion unit 200 of the second substrate (the second signal) to outside the imaging apparatus. By such a configuration, a scale of the circuit can be reduced, and the effect of reducing the power consumption can be acquired.

Further, similarly to the first embodiment, in the present exemplary embodiment, the input node of the amplification transistor 103 (the FD unit 105) and the input node of the amplification transistor 203 (the FD unit 205) are electrically separated from each other. According to such a configuration, the SN ratio can be improved.

A fourth exemplary embodiment will be described. An imaging apparatus according to the present exemplary embodiment is similar to the imaging apparatus according to the second exemplary embodiment except for differences in the function and the configuration of the column readout circuit 302. Therefore, in the following description, the fourth exemplary embodiment will be described mainly focusing on differences from the second exemplary embodiment and omitting descriptions of similar features to the second exemplary embodiment as appropriate.

The imaging apparatus according to the present exemplary embodiment is configured in a similarly manner to the imaging apparatus according to the second exemplary embodiment. In other words, FIGS. 4, and 5A and 5B schematically illustrate the configuration of the imaging apparatus according to the present exemplary embodiment. The descriptions about FIGS. 4 and 5A and 5B entirely apply to the present exemplary embodiment.

The column readout circuit 302 according to the present exemplary embodiment adds the signal based on the charge generated in the photoelectric conversion unit 100 of the first substrate (hereinafter referred to as the first signal), and the signal based on the charge generated in the photoelectric conversion unit 200 of the second substrate (hereinafter referred to as the second signal). The column readout circuit 302 will be described in detail.

Figure 10:
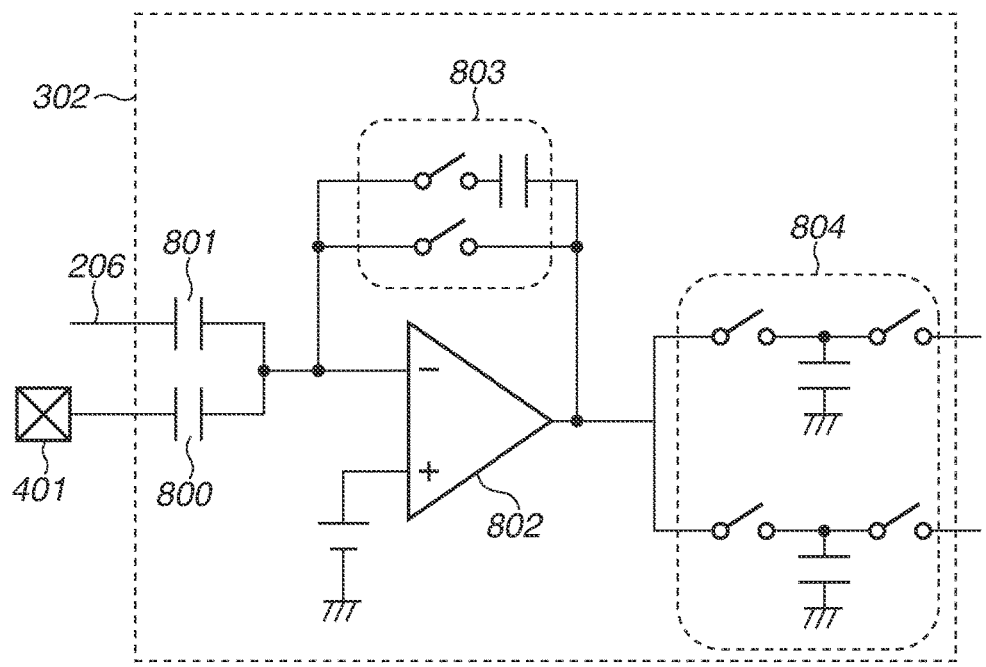
FIG. 10 illustrates an equivalent circuit of a column readout circuit of an imaging apparatus.

FIG. 10 illustrates an equivalent circuit of the column readout circuit 302. The column readout circuit 302 includes a first capacitive element 800, a second capacitive element 801, an operation amplifier 802, a feedback circuit 803, and a sample-and-hold circuit 804.

The column output line 106 of the first substrate is connected to an inverting input node of the operation amplifier 802 via the connection portion 401 and the first capacitive element 800. One end of the first capacitive element 800 is connected to the connection portion 401, and the other end of the first capacitive element 800 is connected to the inverting input node of the operation amplifier 802. The column output line 206 of the second substrate is connected to the inverting input node of the operation amplifier 802 via the second capacitive element 801. One end of the second capacitive element 801 is connected to the column output line 206, and the other end of the second capacitive element 801 is connected to the inverting input node of the operation amplifier 802. A predetermined reference voltage is supplied to a non-inverting input node of the operation amplifier 802.

The feedback circuit 803 includes a feedback capacitor, a feedback switch connected in series with the feedback capacitor, and a reset switch connected in parallel with the feedback capacitor. The feedback circuit 803 forms a negative feedback loop between an output node and the inverting input node of the operation amplifier 802. The sample-and-hold circuit 804 includes a sampling switch, a holding capacitive element, and a transfer switch.

An operation for the column readout circuit 302 to add the signals will be described. First, the inverting input node of the operation amplifier 802 is reset by turning on the reset switch. After the reset switch is turned off, the feedback switch is turned on. Subsequently, the first signal and the second signal are input to the first capacitive element 800 and the second capacitive element 801, respectively. By this operation, the operation amplifier 802 outputs a signal having an amplitude corresponding to a sum of an amplitude of the first signal and an amplitude of the second signal.

Figure 11:
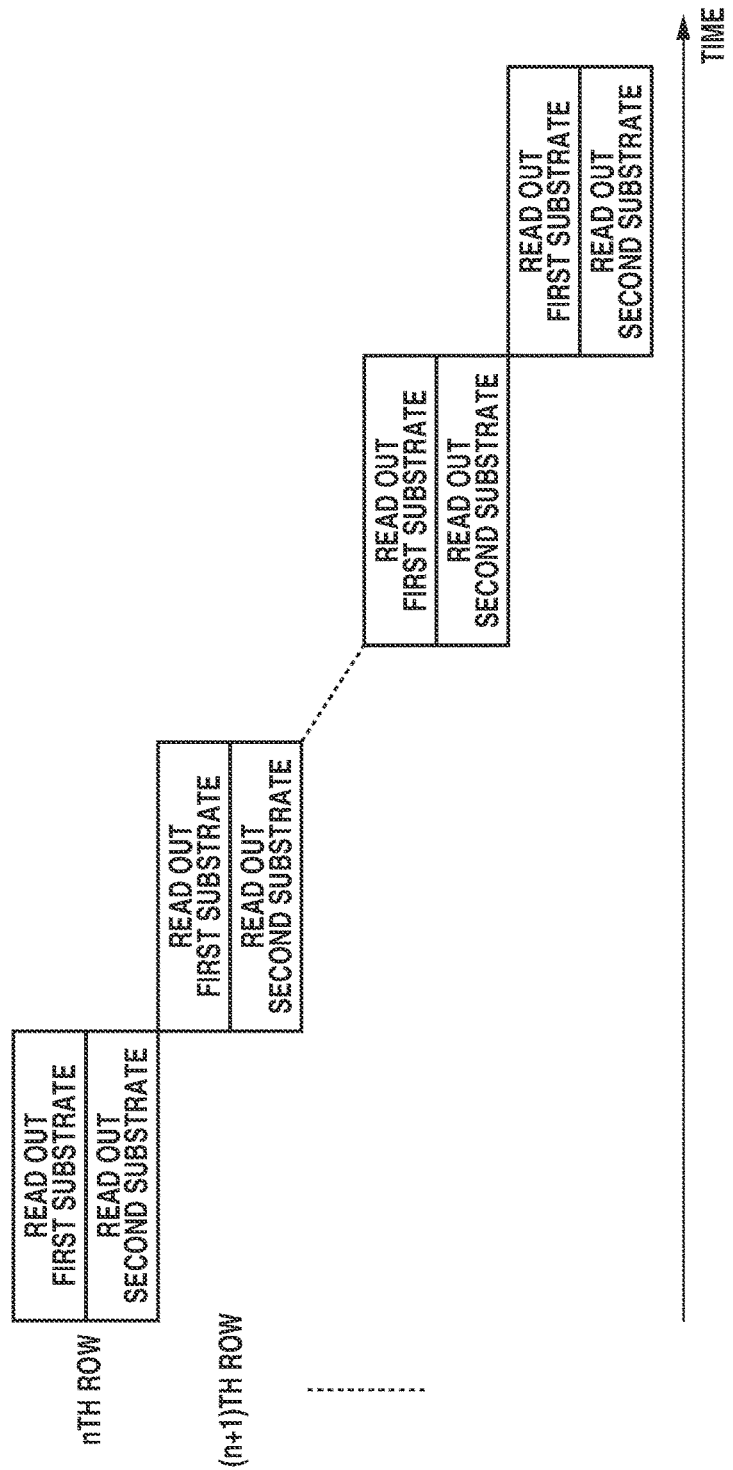
FIG. 11 schematically illustrates an operation of the imaging apparatus.

FIG. 11 schematically illustrates an operation of the imaging apparatus according to the present exemplary embodiment. The above-described reset of the operation amplifier 802 and addition of the first signal and the second signal are carried out during a time period indicated as one readout time period in FIG. 11. First, the signal of the pixel 301 in the n-th row in the pixel array of the first substrate (the first signal) is read out. At the same time, the signal of the pixel 301 in the n-th row in the pixel array of the second substrate (the second signal) is read out. Therefore, the first signal and the second signal are input to the readout circuit 302 at the same time, and then added. Subsequently, the pixel 301 in the (n+1)th row is read out. After that, a similar operation is repeated.

By such a configuration, the SN ratio of the signal can be improved. For example, a commonly-used photoelectric conversion unit converts light having a long wavelength with low efficiency. Therefore, a part of the light incident on the photoelectric conversion unit 100 of the first substrate may pass through the first substrate. According to the present exemplary embodiment, the light transmitted through the first substrate is incident on the photoelectric conversion unit 200 of the second substrate, and is converted into the signal charge. Then, the column readout circuit 302 adds the signal based on the charge generated in the photoelectric conversion unit 100 of the first substrate (the first signal) and the signal based on the charge generated in the photoelectric conversion unit 200 of the second substrate (the second signal). In this manner, the present exemplary embodiment can improve the efficiency of converting the light practically.

To add charges generated on different substrates in a state of the charge, a parasitic capacitance of the node where the charges are added is likely to increase. This is because the semiconductor regions of the different substrates are connected to each other via the connection portion like Japanese Unexamined Patent Application Publication (Translation of PCT Application) No. 2014-523148. Therefore, even if effective efficiency of converting the light is improved, it is difficult to improve the SN ratio because the efficiency of converting the charge into the voltage reduces. On the other hand, in the present exemplary embodiment, the input node of the amplification transistor 103 (the FD unit 105) and the input node of the amplification transistor 203 (the FD unit 205) are electrically separated from each other similarly to the first to third exemplary embodiments. Therefore, the charge can be converted into the voltage signal with high conversion efficiency. As a result, the present exemplary embodiment can succeed in improving the SN ratio.

The first signal and the second signal are added in the present exemplary embodiment, but the first signal and the second signal are averaged in an exemplary modification. Averaging the signals can also acquire the effect of improving the SN ratio similarly to the present exemplary embodiment.

A fifth exemplary embodiment will be described. An imaging apparatus according to the present exemplary embodiment is different from the imaging apparatus according to the fourth exemplary embodiment in terms of the imaging apparatus having a mode in which the signal processing circuit adds the first signal and the second signal, and a mode in which the signal processing circuit outputs the first signal and the second signal independently in the present exemplary embodiment. Therefore, in the following description, the fifth exemplary embodiment will be described mainly focusing on differences from the fourth exemplary embodiment and omitting descriptions of similar features to the fourth exemplary embodiment as appropriate.

Figure 12:
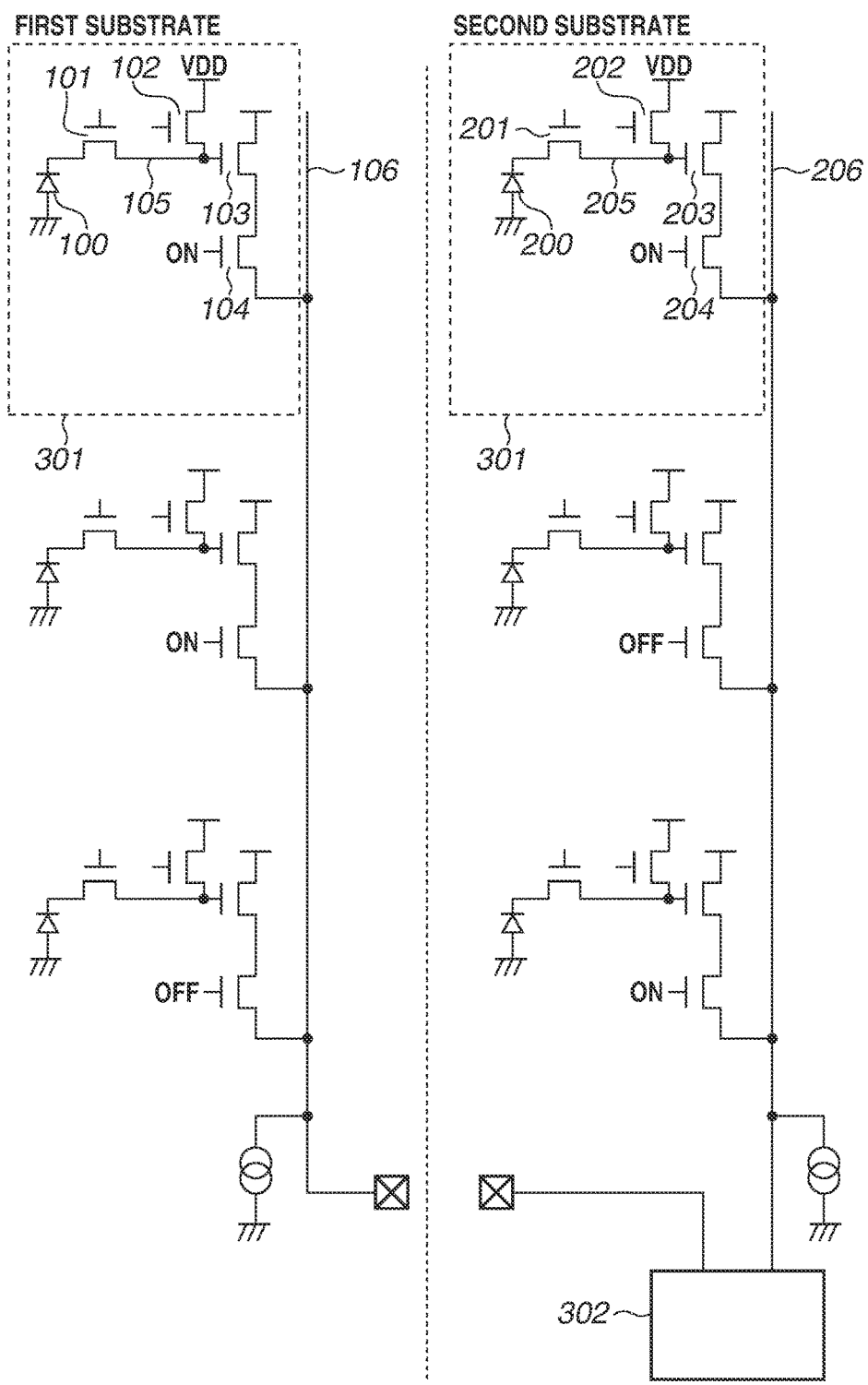
FIG. 12 illustrates an equivalent circuit of a pixel of an imaging apparatus.

FIG. 12 illustrates an equivalent circuit of the pixel 301 of the imaging apparatus according to the exemplary embodiment. Each pixel 301 is configured in a similar manner to the first to fourth exemplary embodiments. In other words, the description about FIG. 2 entirely applies to the present exemplary embodiment.

First, an addition mode of adding the signal based on the charge generated in the photoelectric conversion unit 100 of the first substrate (hereinafter referred to as the first signal) and the signal based on the charge generated in the photoelectric conversion unit 200 of the second substrate (the hereinafter referred to as the second signal) will be described. In the addition mode, the selection transistor 104 of the first substrate and the selection transistor 204 of the second substrate are turned on at the same time as illustrated in a top row in FIG. 12. As a result, the first signal and the second signal are input to the column readout circuit 302 at the same time. The function and the configuration of the column readout circuit 302 are similar to the column readout circuit 302 according to the fourth exemplary embodiment, and therefore descriptions thereof will be omitted here.

Next, a non-addition mode of outputting the first signal and the second signal independently will be described. In the non-addition mode, one of the selection transistor 104 of the first substrate and the selection transistor 204 of the second substrate is turned on, and the other of them is turned off as illustrated in a middle row or a bottom row in FIG. 12. As a result, the first signal and the second signal are input to the column readout circuit 302 sequentially. The column readout circuit 302 outputs the first signal and the second signal individually.

In the present exemplary embodiment, the imaging apparatus selectively employs whether to read out the first signal and the second signal while adding them or read out the first signal and the second signal without adding them according to a color of the pixel 301. For example, the pixel 301 having a red color filter CF adds the first signal and the second signal to each other. On the other hand, the pixel 301 with a blue color filter CF disposed thereon reads out the signals in the non-addition mode. In a case where light having a short wavelength such as a blue color is incident, most of the incident light is converted in the photoelectric conversion unit 100 of the first substrate. Therefore, refraining from reading out the signal from the pixel 301 of the second substrate allows the imaging apparatus to reduce the power consumption.

In this manner, according to the imaging apparatus of the present exemplary embodiment, the power consumption can be reduced in addition to the effects acquired by the imaging apparatuses according to the first to fourth exemplary embodiments.

Figure 13:
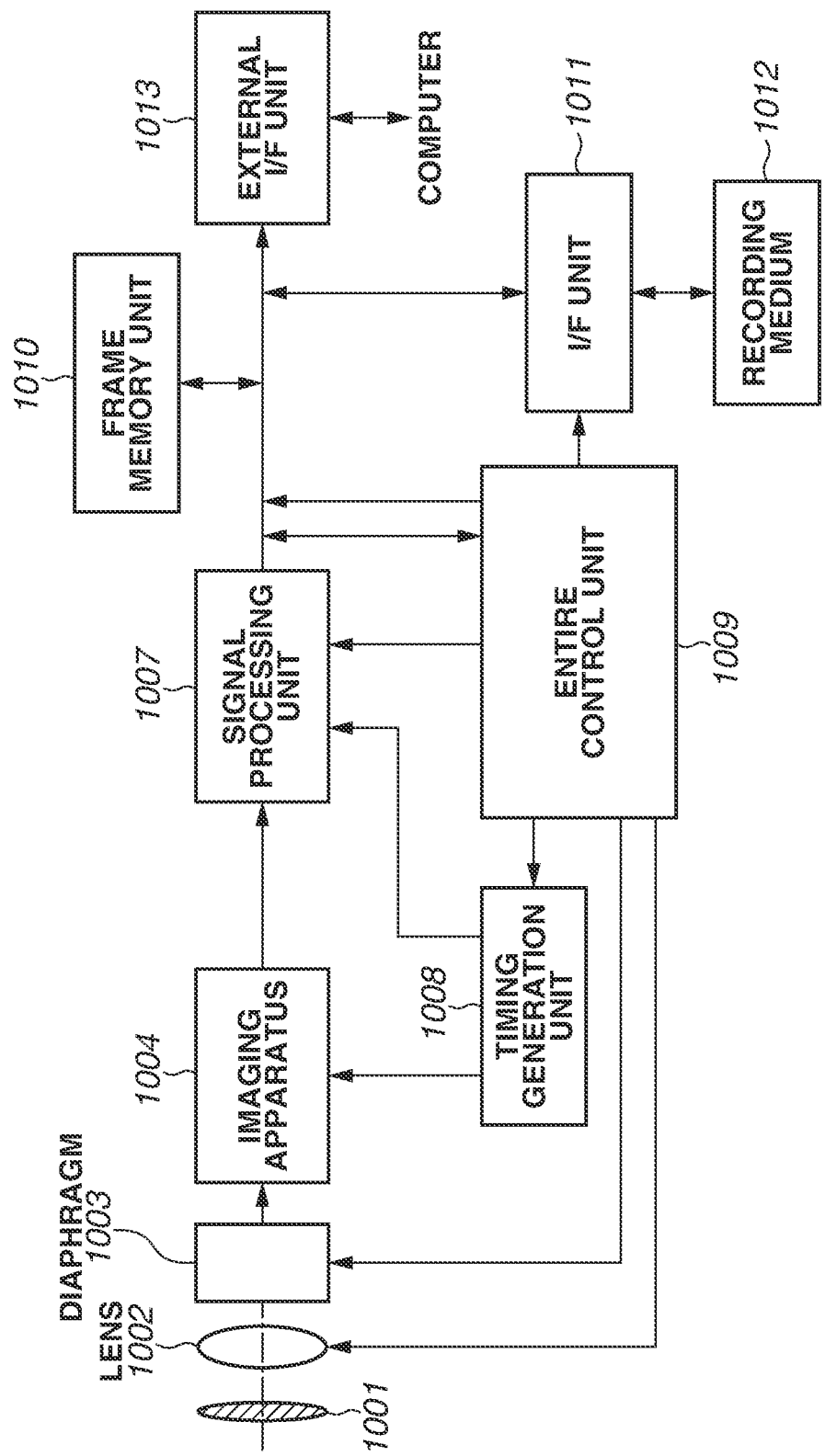
FIG. 13 is a block diagram illustrating an exemplary embodiment of an imaging system.

An exemplary embodiment of an imaging system will be described. Examples of the imaging system include a digital still camera, a digital camcorder, a camera head, a copying machine, a facsimile machine, a mobile phone, an in-vehicle camera, and an observatory satellite. FIG. 13 illustrates a block diagram of the digital still camera as an example of the imaging system.

In FIG. 13, a barrier 1001 functions to protect a lens. A lens 1002 allows an optical image of a subject to be formed on an imaging apparatus 1004. A diaphragm 1003 functions to vary a light amount transmitted through the lens 1002. The imaging apparatus described in any of the above-described individual exemplary embodiments is used as the imaging apparatus 1004.

A signal processing unit 1007 performs processing such as a correction and a data compression on a pixel signal output from the imaging apparatus 1004 to acquire an image signal. Then, in FIG. 13, a timing generation unit 1008 outputs various kinds of timing signals to the imaging apparatus 1004 and the signal processing unit 1007, and an entire control unit 1009 controls the entire digital still camera. A frame memory unit 1010 functions to temporarily store image data. An interface unit 1011 functions to record or read data into or out of a recording medium. A detachably attachable recording medium 1012, such as a semiconductor memory, functions to record or read imaging data therein or therefrom. An external interface unit 1013 functions to communicate with an external computer and the like.

The imaging system only has to include at least the imaging apparatus 1004, and the signal processing unit 1007 that processes the pixel signal output from the imaging apparatus 1004. In this case, the other configuration is disposed outside the imaging system.

In the above-described manner, in the exemplary embodiment of the imaging system, the imaging apparatus according to any of the first to fifth exemplary embodiments is used as the imaging apparatus 1004. According to such a configuration, the SN ratio of the signal output from the imaging apparatus can be improved.

Figure 14A:
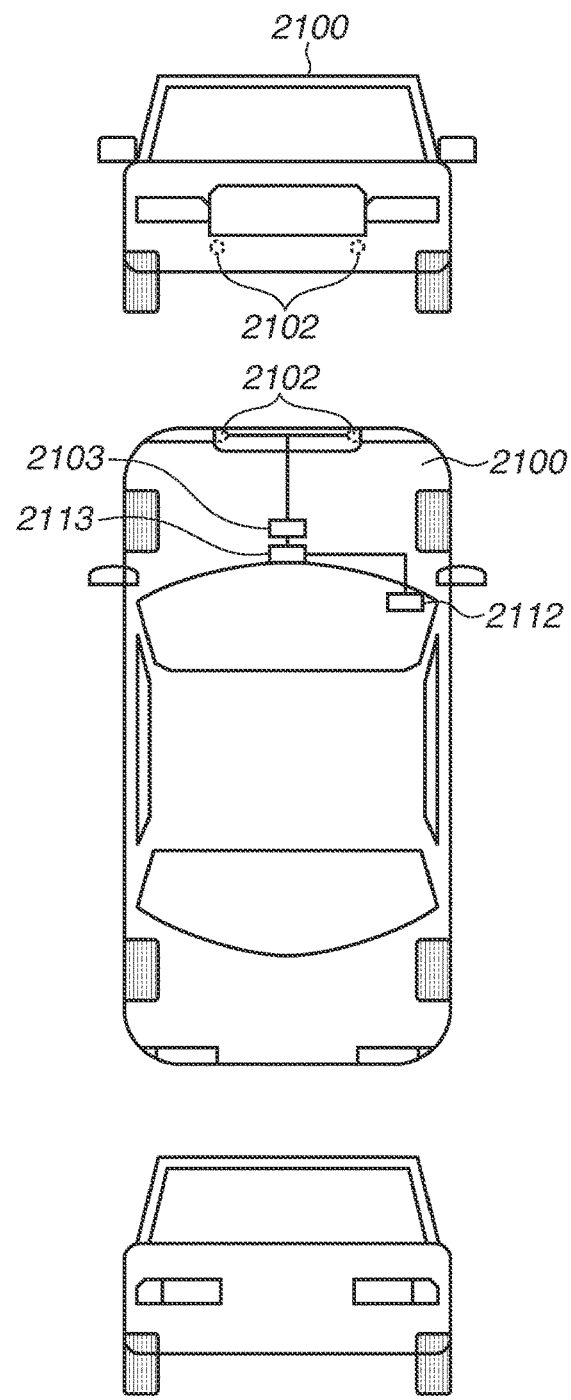

An exemplary embodiment of a moving object will be described. The moving object according to the present exemplary embodiment is an automobile equipped with an in-vehicle camera. FIG. 14A schematically illustrates an external appearance and a main internal configuration of an automobile 2100. The automobile 2100 includes imaging apparatuses 2102, an imaging system integrated circuit (an application specific integrated circuit (ASIC)) 2103, a warning apparatus 2112, and a main control unit 2113.

The imaging apparatus described in any of the above-described individual exemplary embodiments is used as each of the imaging apparatuses 2102. The warning apparatus 2112 issues a warning to a driver when receiving a signal indicating an abnormality from an imaging system, vehicle sensors, control units, or the like. The main control unit 2113 comprehensively controls operations of the imaging system, the vehicle sensors, the control units, and the like. The automobile 2100 does not have to include the main control unit 2113. In this case, the imaging system, the vehicle sensors, and the control units include respective individual communication interfaces, and each transmit and receive a control signal via a communication network (for example, the Controller Area Network (CAN) standard).

FIG. 14B is a block diagram illustrating a system configuration of the automobile 2100. The automobile 2100 includes a first imaging apparatus 2102 and a second imaging apparatus 2102. In other words, the in-vehicle camera according to the present exemplary embodiment is a stereo camera. An image of a subject is formed on each of the imaging apparatuses 2102 by an optical unit 2114. A pixel signal output from each of the imaging apparatuses 2102 is processed by an image pre-processing unit 2115, and is then transmitted to the imaging system integrated circuit 2103. The image pre-processing unit 2115 performs processing such as a signal-noise (S-N) calculation and an addition of a synchronization signal.

The imaging system integrated circuit 2103 includes an image processing unit 2104, a memory 2105, an optical ranging unit 2106, a parallax calculation unit 2107, an object recognition unit 2108, an abnormality detection unit 2109, and an external interface (I/F) unit 2116. The image processing unit 2104 processes the pixel signal to generate an image signal. Further, the image processing unit 2104 corrects the image signal and complements an abnormal pixel. The memory 2105 temporarily stores the image signal therein. Further, the memory 2105 may store therein a position of a known abnormal pixel in the imaging apparatuses 2102. The optical ranging unit 2106 focuses the imaging apparatuses 2102 on the subject or measures a distance to the subject with use of the image signal. The parallax calculation unit 2107 carries out subject matching (stereo matching) between parallax images. The object recognition unit 2108 analyzes the image signal to recognize the subject, such as an automobile, a human, a sign, and a road. The abnormality detection unit 2109 detects a failure or a malfunction of each of the imaging apparatuses 2102. The abnormality detection unit 2109 transmits a signal indicating that an abnormality is detected to the main control unit 2113 when detecting the failure or the malfunction. The external I/F unit 2116 mediates supply and reception of information between each of the units in the imaging system integrated circuit 2103 and, for example, the main control unit 2113 or various control units.

The automobile 2100 includes a vehicle information acquisition unit 2110 and a driving aid unit 2111. The vehicle information acquisition unit 2110 includes the vehicle sensors, such as a speed/acceleration sensor, an angular speed sensor, a steering angle sensor, a ranging radar, and a pressure sensor.

The driving aid unit 2111 includes a collision determination unit. The collision determination unit determines whether the automobile 2100 may collide with an object based on information from the optical ranging unit 2106, the parallax calculation unit 2107, and/or the object recognition unit 2108. The optical ranging unit 2106 and the parallax calculation unit 2107 are one example of a distance information acquisition unit that acquires distance information to a target. In other words, the distance information refers to information regarding a parallax, a defocus amount, a distance to the target, and/or the like. The collision determination unit may determine a collision possibility with use of any of these pieces of distance information. The distance information acquisition unit may be realized by hardware designed especially therefor or may be realized by a software module.

The present exemplary embodiment has been described based on the example in which the driving aid unit 2111 controls the automobile 2100 so as to prevent the automobile 2100 from colliding with another object, but can also be applied to control of automatically driving the automobile 2100 so as to follow another vehicle, control of automatically driving the automobile 2100 so as to prevent the automobile 2100 from deviating from a traffic lane, and the like.

The automobile 2100 further includes driving units to be used when the automobile 2100 runs, such as an airbag, an accelerator, a brake, a steering, and a transmission. Further, the automobile 2100 includes control units for them. The control units each control the corresponding driving unit based on the control signal from the main control unit 2113.

The imaging system used in the present exemplary embodiment can be applied to not only the automobile but also a moving object (a moving apparatus) such as a ship, an airplane, or an industrial robot. In addition, the imaging system used in the present exemplary embodiment can be applied to not only the moving object but also an apparatus widely using object recognition, such as an intelligent transportation system (ITS).

In the above-described manner, in the exemplary embodiment of the automobile, the imaging apparatus according to any of the first to fifth exemplary embodiments is used as each of the imaging apparatuses 2102. According to such a configuration, the SN ratio of the signal output from the imaging apparatus can be improved.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-228063, filed Nov. 24, 2016, which is hereby incorporated by reference herein in its entirety.

What is claimed is:

1. An imaging apparatus comprising:
a first substrate including a plurality of first pixels arranged thereon, the plurality of first pixels each including a first photoelectric conversion unit and a first transistor configured to output a first signal based on a charge generated in the first photoelectric conversion unit; and
a second substrate including a plurality of second pixels arranged thereon, the plurality of second pixels each including a second photoelectric conversion unit and a second transistor configured to output a second signal based on a charge generated in the second photoelectric conversion unit,
wherein the first substrate and the second substrate are stacked via an insulation film interposed therebetween,
wherein an orthogonal projection of the first photoelectric conversion unit onto a plane in parallel with an interface between the first substrate and the insulation film and an orthogonal projection of the second photoelectric conversion unit onto the plane at least partially overlap each other, and
wherein an input node of the first transistor and an input node of the second transistor are separated from each other.

2. The imaging apparatus according to claim 1, further comprising:
a first output line connected to the plurality of first pixels;
a second output line connected to the plurality of second pixels; and
a signal processing circuit disposed on the second substrate and configured to process the first signal to the first output line and the second signal to the second output line.

3. The imaging apparatus according to claim 2, wherein the signal processing circuit adds or averages the first signal and the second signal.

4. The imaging apparatus according to claim 2, wherein the signal processing circuit outputs the first signal and the second signal to outside independently of each other.

5. The imaging apparatus according to claim 4, wherein the first signal and the second signal are used for purposes different from each other.

6. The imaging apparatus according to claim 2, wherein the signal processing circuit adds or averages the first signal and the second signal in a first mode, and
wherein the signal processing circuit outputs the first signal and the second signal to outside independently of each other in a second mode.

7. The imaging apparatus according to claim 2, wherein the signal processing circuit converts each of the first signal and the second signal from an analog signal to a digital signal.

8. The imaging apparatus according to claim 2, wherein incident light is incident on the first photoelectric conversion unit, and
wherein a part of the incident light incident on the first photoelectric conversion unit passes through the first photoelectric conversion unit to be incident on the second photoelectric conversion unit.

9. The imaging apparatus according to claim 2, wherein the first output line and the second output line are disposed between the first substrate and the second substrate, wherein a part of the insulation film is disposed between the first output line and a part of the first substrate, and wherein another part of the insulation film is disposed between the first output line and a part of the second substrate.

10. The imaging apparatus according to claim 9, wherein a connection portion where a wiring of the first substrate and a wiring of the second substrate are connected to each other is included in a wiring path connecting the first output line and the signal processing circuit to each other.

11. The imaging apparatus according to claim 1, further comprising:
a first output line connected to the plurality of first pixels;
a first signal processing circuit disposed on the first substrate and configured to process a first signal output from the first transistor to the first output line;
a second output line connected to the plurality of second pixels; and
a second signal processing circuit disposed on the second substrate and configured to process a second signal output from the second transistor to the second output line.

12. The imaging apparatus according to claim 11, wherein the first signal and the second signal are different from each other.

13. The imaging apparatus according to claim 11, wherein the first signal processed by the first signal processing circuit and the second signal processed by the second signal processing circuit are added or averaged.

14. The imaging apparatus according to claim 11, wherein the first signal processing circuit converts the first signal from an analog signal to a digital signal, and
wherein the second signal processing circuit converts the second signal from an analog signal to a digital signal.

15. The imaging apparatus according to claim 11, wherein incident light is incident on the first photoelectric conversion unit, and
wherein a part of the incident light incident on the first photoelectric conversion unit passes through the first photoelectric conversion unit to be incident on the second photoelectric conversion unit.

16. The imaging apparatus according to claim 11, wherein the first output line and the second output line are disposed between the first substrate and the second substrate,
wherein a part of the insulation film is disposed between the first output line and a part of the first substrate, and
wherein another part of the insulation film is disposed between the first output line and a part of the second substrate.

17. The imaging apparatus according to claim 11, wherein a connection portion where a wiring of the first substrate and a wiring of the second substrate are connected to each other is included in a wiring path connecting the first signal processing circuit and the second signal processing circuit to each other.

18. An imaging apparatus comprising:
a first substrate including a plurality of first pixels arranged thereon, the plurality of first pixels each including a first photoelectric conversion unit and a first transistor configured to output a first signal based on a charge generated in the first photoelectric conversion unit; and
a second substrate including a plurality of second pixels arranged thereon, the plurality of second pixels each including a second photoelectric conversion unit and a second transistor configured to output a second signal based on a charge generated in the second photoelectric conversion unit,
wherein the first substrate and the second substrate are stacked via an insulation film interposed therebetween,
wherein a part of incident light incident on the first photoelectric conversion unit passes through the first photoelectric conversion unit to be incident on the second photoelectric conversion unit, and
wherein an input node of the first transistor and an input node of the second transistor are separated from each other.

19. A system comprising:
the imaging apparatus according to claim 1; and
a processing apparatus configured to process the first or second signal output from the imaging apparatus to acquire an image signal.

20. A moving object comprising:
the imaging apparatus according to claim 1;
a processing apparatus configured to perform processing on the first or second signal output from the imaging apparatus; and
a control unit configured to control the moving object based on a result of the processing.

* * * * *